United States Patent [19]

Russell et al.

[11] Patent Number: 5,600,526

[45] Date of Patent: Feb. 4, 1997

[54] LOAD ANALYSIS SYSTEM FOR FAULT DETECTION

[75] Inventors: B. Don Russell; B. Michael Aucoin, both of College Station; Carl L. Benner, Bryan, all of Tex.

[73] Assignee: The Texas A & M University System, College Station, Tex.

[21] Appl. No.: 138,144

[22] Filed: Oct. 15, 1993

[51] Int. Cl.$^6$ ........................................... H02H 3/00
[52] U.S. Cl. ............................ 361/65; 361/79; 361/115
[58] Field of Search .................................. 361/42, 47, 65, 361/79, 93, 115, 24; 324/113, 51, 102

[56] References Cited

U.S. PATENT DOCUMENTS

| | | | |
|---|---|---|---|
| 3,308,345 | 3/1967 | Van Cortlandt Warrington | 324/520 |
| 3,515,943 | 6/1970 | Van Cortlandt Warrington | 324/520 |
| 4,281,386 | 7/1981 | Kondow et al. | 364/492 |
| 4,297,738 | 10/1981 | Lee | 361/42 |
| 4,313,146 | 1/1982 | Lee | 361/85 |
| 4,347,542 | 8/1982 | Calhoun | 361/76 |
| 4,347,738 | 9/1982 | Sanderson | 73/170 A |
| 4,362,986 | 12/1982 | Burke et al. | 324/51 |
| 4,466,071 | 8/1984 | Russell, Jr. | 361/83 |
| 4,470,092 | 9/1984 | Lombardi | 361/23 |
| 4,559,491 | 12/1985 | Saha | 324/52 |
| 4,719,580 | 1/1988 | Nimmersjö | 364/483 |
| 4,751,653 | 6/1988 | Junk et al. | 364/481 |
| 4,752,886 | 6/1988 | Gareis | 364/483 |
| 4,766,549 | 8/1988 | Schweitzer, III et al. | 364/481 |
| 4,785,406 | 11/1988 | Lunderius et al. | 364/483 |
| 4,795,983 | 1/1989 | Crockett et al. | 324/521 |
| 4,800,509 | 1/1989 | Nimmersjö | 364/492 |
| 4,812,995 | 3/1989 | Girgis et al. | 364/481 |
| 4,851,782 | 7/1989 | Jeerings et al. | 324/520 |
| 4,853,175 | 8/1989 | Book, Sr. | 376/216 |
| 4,855,671 | 8/1989 | Fernandes | 324/127 |
| 4,864,453 | 9/1989 | Bergman et al. | 361/66 |
| 4,868,704 | 9/1989 | Cavero | 361/80 |
| 4,871,971 | 10/1989 | Jeerings et al. | 361/79 |
| 4,878,142 | 10/1989 | Bergman et al. | 361/80 |
| 4,991,105 | 2/1991 | Pimental | 364/483 |
| 5,003,486 | 3/1991 | Hendel | 364/483 |

OTHER PUBLICATIONS

M. Aucoin, B. D. Russell, "Distribution High Impedance Fault Detection Utilizing High Frequency Current Components," *IEEE Transactions on Power Apparatus and Systems*, vol. PAS-101, No. 6, Jun., 1982, pp. 1596–1606.

M. Aucoin, B. D. Russell, "Detection of Distribution High Impedance Faults Using Burst Noise Signals Near 60 Hz," *IEEE Transactions on Power Delivery*, vol. PWRD-2, No. 2, Apr., 1987, pp. 342–348.

B. D. Russell, B. M. Aucoin, T. J. Talley, "Detection of Arcing Faults on Distribution Feeders," EL–2757, Research Project 1285-3, Final Report, Dec., 1982.

Carl Lee Benner, "An Algorithm for Faulted Phase and Feeder Selection Under High Impedance Fault Conditions," A Thesis Submitted to the Graduate College of Texas A&M University, Aug., 1988.

(List continued on next page.)

*Primary Examiner*—Jeffrey A. Gaffin
*Assistant Examiner*—Stephen Jackson
*Attorney, Agent, or Firm*—Flehr, Hohbach, Test, Albritton & Herbert

[57] ABSTRACT

To prevent unnecessary power outages, and to remove feeder lines from service only when certain hazardous fault conditions occur, a load analysis system including an apparatus and method, monitors the load level of a feeder line and determines the presence of any arcing on the feeder line. In a two stage load pattern analysis, the presence of arcing and load current level changes are used to discriminate high impedance, low current conditions including a downed conductor, a broken and dangling conductor, a tree or object contact with the feeder line, overcurrent activities, and normal switching events such as recloser operation. The load analysis system also provides output commands including wait, alarm, trip-ready, trip and normal, depending upon which status is diagnosed.

17 Claims, 4 Drawing Sheets

OTHER PUBLICATIONS

Patrick Wayne Carswell, "The Detection of High Impedance Faults Using Random Fault Behavior," A Thesis Submitted to the Graduate College of Texas A&M Univerity, Aug., 1988.

C. Benner, P. Carswell, B. D. Russell, "Improved Algorithm for Detecting Arcing Faults Using Random Fault Behavior," *Electric Power Systems Research*, vol. 17, 1989, pp. 49–56.

Expert System for Detecting High Impedence Faults, U.S. Pat. application Ser. No. 08/138,392, filed Oct. 15, 1993, invented by Russell.

Energy Analysis Fault Detection System, U.S. Pat. application Ser. No. 08/138,146, filed Oct. 15, 1993, invented by Russell et al.

ARC Spectral Analysis System, U.S. Pat. application Ser. No. 08/138,489, filed Oct. 15, 1993, invented by Russell et al.

Load Extraction Fault Detection System, U.S. Pat. application Ser. No. 08/138,413, filed Oct. 15, 1993, invented by Russell et al.

Randomness Fault Detection System, U.S. Pat. application Ser. No. 08/138,410, filed Oct. 15, 1993, invented by Russell et al.

ARC Burst Pattern Analysis Fault Detection System, U.S. Pat. application Ser. No. 08/138,477, filed Oct. 15, 1993, by Russell et al.

Aucoin et al, "Detection of Incident and Low Current Faults in Elecrtic Distribution Systems", Intersociety Energy Conversion Engineering Conference, Washington, D.C., Aug. 1989.

Aucoin et al, "High Impedence Fault Detection for Industrial Power Systems"IEEE Industry Applications Society Conference, San Diego, Oct., 1989.

LOAD ANALYSIS SYSTEM FOR FAULT DETECTION

BACKGROUND OF THE INVENTION

The present invention relates generally to a load analysis system for use with an electrical utility power system, and more particularly to a load analysis system for distinguishing high impedance, low current faults from other normal events and activities on the power system. High impedance faults may be caused by, for example, downed, broken, tangled or dangling power lines, trees contacting the power lines, and various overcurrent fault situations.

High impedance, low current faults are more difficult to detect than permanent overcurrent faults, such as when a transformer fails. Conventional overcurrent protection devices have time delays which allow a temporary fault to clear, and if the overcurrent fault persists only then does the device deenergize the power line. High impedance, low current faults may initialize the timing circuits of the overcurrent protection devices but, by the end of the delay, the high impedance nature of the fault limits the fault current to a low value. The overcurrent protection devices cannot distinguish this low fault current from the levels of current ordinarily drawn by customers, so the lines may remain energized even though a conductor has broken.

Other methods of detecting high impedance faults have focused on detecting third harmonics generated by the arcing behavior of the high impedance faults. These earlier methods use detection algorithms having variations in harmonic current as the detection parameter. For instance, U.S. Pat. No. 4,851,782 to Jeerings detects high impedance, low current faults by analyzing third harmonic currents on the power lines.

By relying only on the arcing behavior for detection, high impedance fault detection systems using such methods experience significant reliability problems. These systems lack security against a false trip, causing unnecessary blackouts for the utility's customers. For example, a tree limb momentarily touching a power line may cause a momentary fault, which is cleared when the tree limb moves away from the power line. These earlier systems may misinterpret this momentary tree contact as a permanent high impedance fault, and in response cause breakers to trip to deenergize the line. Such systems may also interpret normal switching actions of the power system protection equipment as a permanent high impedance fault and cause unnecessary trips.

A primary goal of electrical utilities is to minimize such false fault detections. Most utilities need a load analysis system which detects and deenergizes a power line only for hazardous faults, such as when a broken conductor is on the ground. During other minor fault conditions, such as a broken power line dangling out of the reach of the public, it may be desirable to leave the power line energized. Although a dangling power line is hazardous, service interruptions to the electric utility's customers can also pose significant safety problems.

Thus, a need exists for an improved high impedance fault detection system for electrical power utilities which is directed toward overcoming, and not susceptible to, the above limitations and disadvantages.

SUMMARY OF THE INVENTION

Thus, there is a clear need for a load analysis system having fault detection techniques which accurately identify hazardous faults requiring line deenergization, and which accurately discriminates, or distinguishes, a hazardous fault from other events for which the line should remain energized. The present invention encompasses such a load analysis system which minimizes unnecessary power service interruptions and outages.

In accordance with an illustrated embodiment of the present invention, a method of analyzing faults occurring on a distribution circuit coupled to an AC power system, includes the step of monitoring a load current flowing over the distribution circuit. In an analyzing step, the load current is analyzed over time. In an identifying step, either the occurrence of a normal system event, a hazardous fault or a minor fault are identified from the analyzed load current. As used herein, hazardous faults are those requiring deenergization of the distribution circuit, and minor faults are those for which the distribution circuit may remain energized. The distribution line should also remain energized during normal system events, such as during switching events.

In accordance with another illustrated embodiment of the present invention, a load analysis apparatus is provided for analyzing faults occurring on a distribution circuit coupled to an AC power system. The apparatus includes a monitor for monitoring a load current flowing over the distribution circuit and in response thereto, generating a load signal. The apparatus also has a controller responsive to the monitor for analyzing the load current over time, and for identifying the occurrence of hazardous and minor faults from the analyzed load current.

An overall object of the present invention is to provide a load analysis high impedance fault detection system for minimizing unnecessary power service interruptions and outages.

A further object of the present invention is to provide a load analysis apparatus and method for accurately identifying and discriminating selected high impedance faults which require a power outage to clear, from other power system events and activities during which it is preferable that the power line remains energized.

Still another object of the present invention is to provide a load analysis system which is more reliable than the earlier systems.

The present invention relates to the above features and objects individually as well as collectively. These and other objects, features and advantages of the present invention will become apparent to those skilled in the art from the following description and drawings.

DETAILED DESCRIPTION OF A PREFERRED EMBODIMENT

Figure 1:
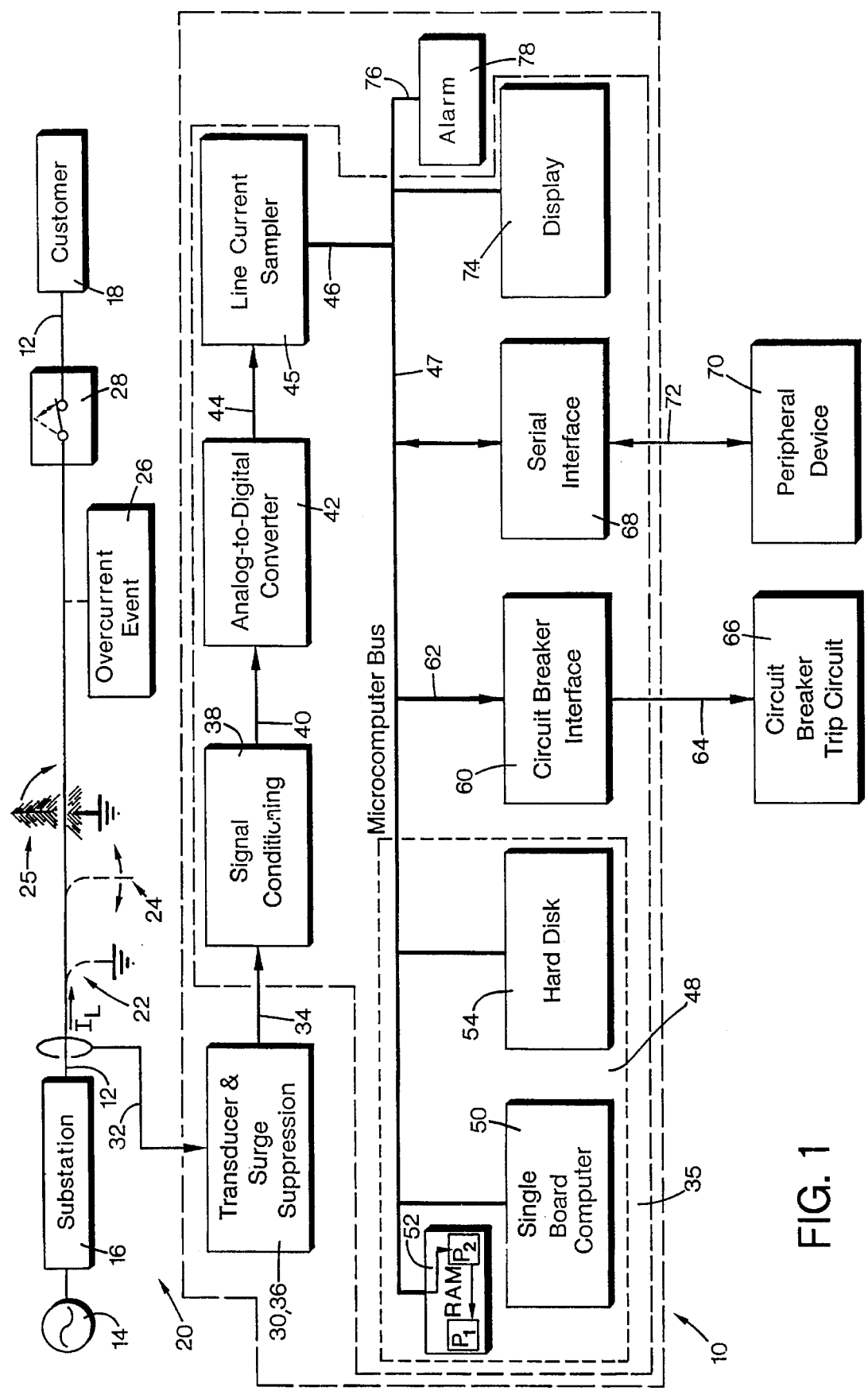
FIG. 1 is a schematic block diagram of one form of a load analysis apparatus of the present invention.

FIG. 1 illustrates an embodiment of a load analyzer 10 constructed in accordance with the present invention. The analyzer 10 distinguishes a high impedance fault from other occurrences on a distribution system conductor, power line, or feeder 12. The feeder 12 receives power from an AC power source, such as a generating station 14, through a substation 16. Other feeder lines (not shown) may also receive power from the generating station 14 and exit the substation 16. The feeder line 12 delivers power from the substation 16 to a variety of customers, such as customer 18. Altogether, the generating station 14, substation 16, and feeder 12 delivering power to the customer 18 illustrate a portion of an electrical utility's power system 20.

Between the substation 16 and the customer 18, the feeder line 12 may be subjected to a variety of different types of events, activities and faults, such as: a downed conductor 22, a dangling conductor 24, momentary contact of a tree or other object 24 with the feeder 12, an overcurrent (Ovc.) event 26, or a switching event 28 performed by a conventional recloser or the like. An overcurrent event 26 may be caused by a variety of events, such as a customer overload, the touching or tangling of two or more phase conductors, a lightning strike, or a broken conductor hitting grounded object or a conductor. These grounded objects may include a feeder pole guy wire, an under-built neutral conductor, or the like.

Although utility engineers distinguish between recloser operation and switching events, with recloser operating automatically and switches being manually operated, the operation of both are collectively referred to herein as "switching events" unless otherwise indicated. Regarding the various faults and normal operations of the power system 20 described herein, the following terms are used herein interchangeably: situation, occurrence, operation, event, and activity.

The load analyzer 10 includes a monitoring device such as a transducer 30 coupled to the feeder 12 as indicated schematically by line 32. Monitoring device is defined broadly herein to include sensing devices, detecting devices, and any other form thereof known to be interchangeable by those skilled in the art. The illustrated transducer 30 senses or monitors a load current $I_L$ flowing through feeder 12. In response to the load current $I_L$, the transducer 30 produces a load current signal 34 that indicates the magnitude and waveform of current flowing in feeder 12. The transducer 30 may be a conventional transducer or equivalent device, such as multiple current transformers typically with one current transformer per phase plus one on the neutral.

The load analyzer 10 also includes surge protection, for example, a surge suppressor or protector 36. The surge protector 36 which may be supplied with the transducer 30, as illustrated, or as a separate component. The surge protector 36 protects the load analyzer 10 from power surges on the feeder 12, such as those caused by lightning strikes or the like.

A controller 35 receives the load current signal 34 from the transducer 30. The controller 35 includes a signal conditioner 38 for filtering and amplifying the load current signal 34 to provide a clean conditioned load current signal 40. Preferably, the signal conditioner 38 includes a low pass filter for satisfying the Nyquist criteria of sampling known to those skilled in the art. The signal conditioner 38 also amplifies the load current signal 34 for the appropriate gain required by an analog to digital (A/D) converter 42. For example, the dynamic range of signals received on a power system 20 range from 10 Amps to 10,000 Amps, so the signal conditioner 38 appropriately scales these signals for conversion by the A/D converter 42 from an analog signal 40 into a digital load current signal 44.

The controller 35 includes a discrete A/D converter 42 when transducer 30 is an analog device. The transducer 30 may also be implemented in a digital device which incorporates the signal conditioning function of conditioner 38 and the analog-to-digital conversion function of the A/D converter 42.

The load analyzer 10 also includes a line current sampling device or sampler 45 which samples the digitized current signal 44 at selected intervals to provide an accurate representation of the load level during rapidly changing conditions, such as during overcurrent faults. For example, the sampler 45 may measure the line current and determine either the fundamental frequency component or the rms (root-mean-square) current component. In a preferred embodiment, one rms value is calculated for each one or two cycles of the fundamental power system, such as sixty or thirty values per second for a 60 Hz nominal power system frequency. The sampler 45 provides a sampled current signal 46 corresponding to the sampled line current values. The sampled current signal 46 is supplied via a microcomputer bus 47 to a computing device, such as a microcomputer system 48. The microcomputer system 48 has a computer, such as a single board computer 50, coupled with a memory device, such as a random access memory 52, and a data storage device, such as a hard disk 54. A suitable microcomputer system 48 may include a conventional personal computer or any other form thereof known to be interchangeable by those skilled in the art.

The controller 35 includes a circuit breaker interface 60 for receiving a trip command signal 62 from the computer 50 via the bus 47. In response to the trip command signal 62, the interface 60 sends a trip signal 64 to a circuit breaker trip circuit 66. The trip circuit 66 drives a circuit breaker (not shown) located at substation 16 to deenergize the feeder 12. The controller 35 may include an optional serial interface 68, such as a modem for sending and receiving a peripheral device signal 70 over a telephone network. The interface 68 may communicate with an external peripheral device 70, such as a remotely located power distribution control center. In some systems, the peripheral device 70 may provide a remote input to the load analyzer 10 via the serial interface 68, for example to override previous programming of the load analyzer, such as the initial settings, sensitivity settings, operational delays, etc.

The controller 35 may also include an output device, such as a visual display device 74 or a printer. Preferably, the output display provides a visual indication of the status of the load analyzer 10, the feeder line 12, and previous operating conditions of the feeder. The controller 35 may also provide an alarm signal 76 via bus 47 to an alarm 78 which may be visual, audible, or both.

Operational Overview

As an overview, the operational philosophy of the system has the load analyzer 10 looking for arcing over a long period of time, on the order of several seconds to several tens of seconds, or even minutes, before deciding that a downed conductor condition 22 indeed exists. To reach this downed conductor decision, the arcing is accompanied by either a significant loss of load, signifying the beginning of the event, or by an overcurrent fault. If prolonged arcing is detected that is not accompanied by a loss of load or by an overcurrent condition, the load analyzer 10 interprets the situation as being associated with other types of events, such as by tree contact 25 or by an insulator failure. Preferably, the load analyzer 10 recognizes a significant loss of load because it is precipitous and precedes any overcurrent or open breaker conditions. Preferably these other types of arcing conditions activate an alarm separate from a downed conductor alarm because utility practices may dictate different responses to the two types of arcing conditions.

The presence of arcing may be determined by other methods known to those skilled in the art. Other methods known to those skilled in the art may be used to detect a significant loss of load, and to recognize overcurrent and open breaker conditions.

Preferably, the load analyzer 10 allows conventional overcurrent protection, such as fuses, reclosers, and conventional overcurrent relays to operate first. To accomplish this objective, the load analyzer 10 preferably will delay issuing an output trip signal 64 until a sufficient time period has elapsed after the beginning of the event. Thus, the load analyzer 10 acts as a last resort protection device when conventional overcurrent protection devices have not yet operated. Preferably, this minimum operating time of analyzer 10 may be programmed by the user, to accommodate system protection philosophies which vary from one utility to the next.

FIRST EMBODIMENT

By recognizing and distinguishing the different reactions of the power flow through feeder 12 when subjected to the various events 22–28, the load analyzer 10 determines what type of event has occurred, whether it is a hazardous fault or a minor fault, and what response is appropriate. For example, the downed conductor 22 usually shows a loss of load, unless it is located far from the substation. The downed conductor 22 touches and arcs to a high impedance object, such as the ground. The arcing behavior of the downed conductor 22 lasts for a significantly long period of time, on the order of minutes as opposed to fractions of a second or seconds.

A broken and dangling conductor 24 may also show a loss of load. However, no arcing behavior is exhibited because the end of the dangling conductor 24 does not touch any high impedance objects, as does the downed conductor 22. Momentary contact of a grounded object, such as the tree contact 25, with the feeder 12 may exhibit an arcing phenomenon without any loss or increase of load. Overcurrent activities 26 may involve any combination of phases and the neutral exhibiting an overcurrent which exceeds a specified level, with or without arcing behavior.

A switching event 28 may or may not show any significant load change, and does not show prolonged arcing behavior. Any arcing from a switching event 28 typically lasts less than one second. For example, a recloser action switching event 28 may show significant load increase and load loss, with or without arcing behavior. This load increase and load loss response to the recloser action 28 is repeated in a similar pattern at intervals dictated by the established practice of recloser operation.

A downed conductor 22 may initially look like several different types of faults which complicates the diagnosis. When a downed conductor first breaks and starts falling to the ground, it may hit a guy wire or an under-built neutral conductor, and appear as an overcurrent activity 26. This overcurrent activity causes an overcurrent breaker (not shown) to trip and deenergize the line. A short time later, a recloser operates to reenergize the line, which appears as a switching event 28. By the time the line has been reenergized, the downed conductor 22 may have slipped off the guy wire or the under-built neutral and made arcing contact with the ground. The low level current flowing between the downed conductor 22 and the high impedance ground is usually not high enough to cause further operation of the overcurrent breaker (not shown); hence the need for the load analyzer 10.

Generally, most electrical utilities only want a feeder breaker to trip for a downed conductor 22. The load analyzer 10 identifies downed conductors 22, broken and dangling conductors 24, tree contact 25, and other events, such as overcurrent (Ovc) fault situations 26. To initially distinguish between normal operating conditions and a disrupting event, the load analyzer 10 continually monitors a value of a parameter of the power flowing through the feeder 12, here, the rms of the load current $I_L$. Once a disrupting event is detected, the load analyzer 10 then identifies what type of event has occurred. This event identification is accomplished within the microcomputer system 48 by analyzing the load current patterns in two stages of event classification logic (see FIGS. 2 and 3).

Three important elements of this load pattern analysis scheme are detecting and analyzing:

1) the presence of arcing;

2) changes in the load level; and 3) occurrence of overcurrent activity.

For example, whenever a power line breaks, some percentage of the total feeder load current $I_L$ is lost causing an initial disruption in the rms data monitored by transducer 30. This conductor breakage initiates a sequence of events in which there is a sudden loss of load current $I_L$. If this sudden loss is followed by an indication of arcing, then a downed conductor situation 22 most likely exists. This sequence of events provides a good indicator of the downed conductor scenario, which calls for tripping the feeder. If no arcing follows the sudden load current loss, then it is likely that a dangling conductor situation 24 exists for which many utilities allow the feeder 12 to remain energized. If an overcurrent fault occurs and then vanishes, but is followed by a period of sustained arcing, this is also an indication of a downed conductor (with or without loss of load).

The load analyzer 10 classifies the events by using these three elements, arcing, load level changes, and overcurrent level excursions, to define three analysis variables, flags or signals for use in the logic analysis:

1) Arc,

2) Load-Loss, and

3) Overcurrent Level.

The load analyzer 10 uses these three variables to generate pre-action outputs or commands, action outputs or commands, and several diagnosis outputs. The pre-action commands include:

1) Trip-Ready,

2) Alarm, and

3) Normal.

The action commands include:

1) Trip,

2) Alarm, and

3) Wait.

The action command Trip is initiated by the circuit breaker interface 60 sending signal 64 to the trip circuit 66. The Alarm pre-action and action commands are sent to the alarm 78 by signal 76. The Trip-Ready, Trip, Alarm, Wait and Normal commands are preferably shown on the display 74 along with the diagnosis outputs. The diagnosis outputs characterize the particular conditions of the feeder status, such as normal or one of the five situations 22, 24, 25, 26 or 28. The feeder status and commands may also be sent via signal 72 to a peripheral device 70.

Figure 2:
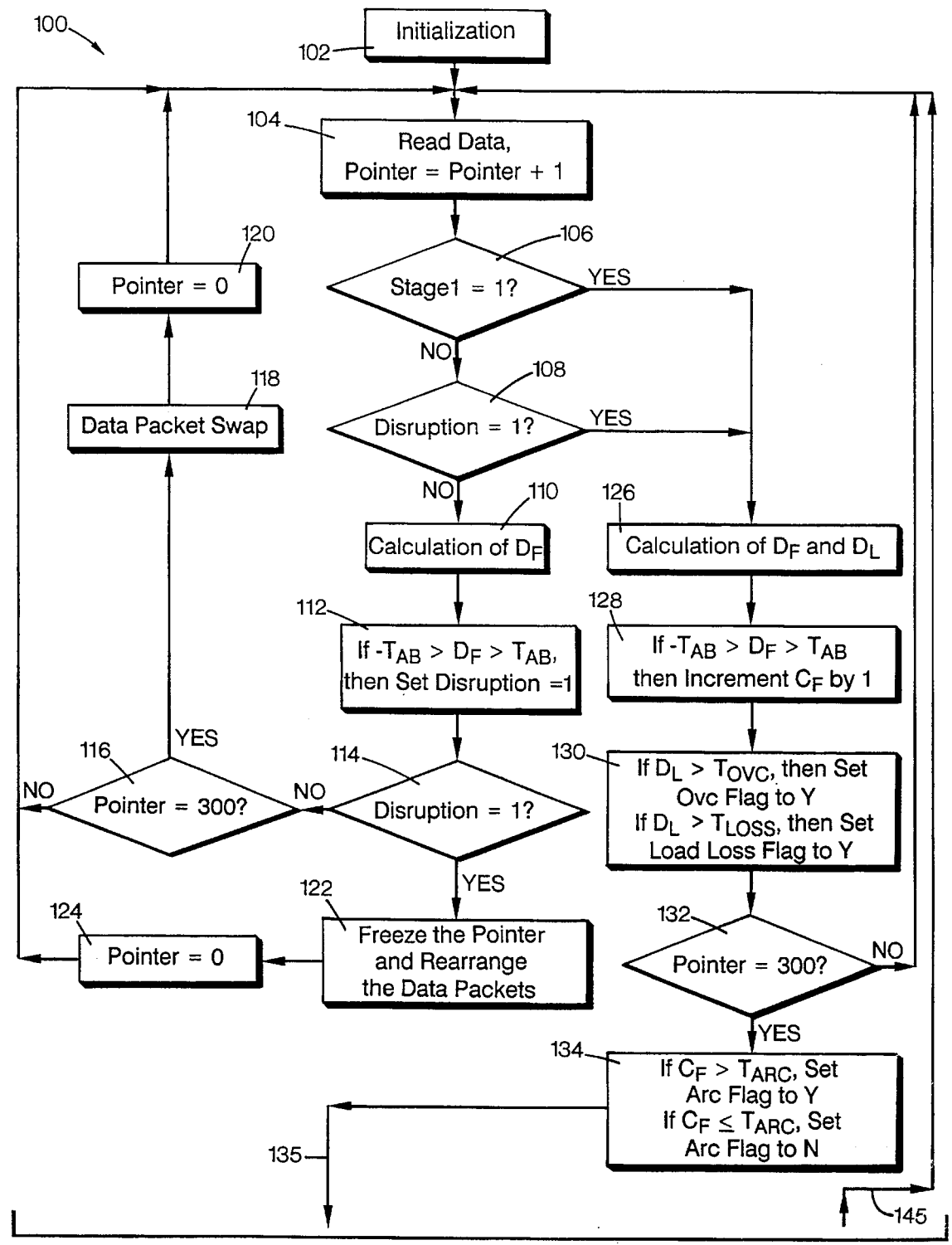
FIGS. 2 and 3 are portions of a flow chart illustrating a first embodiment for operating the load analysis apparatus of FIG. 1.
Figure 3:
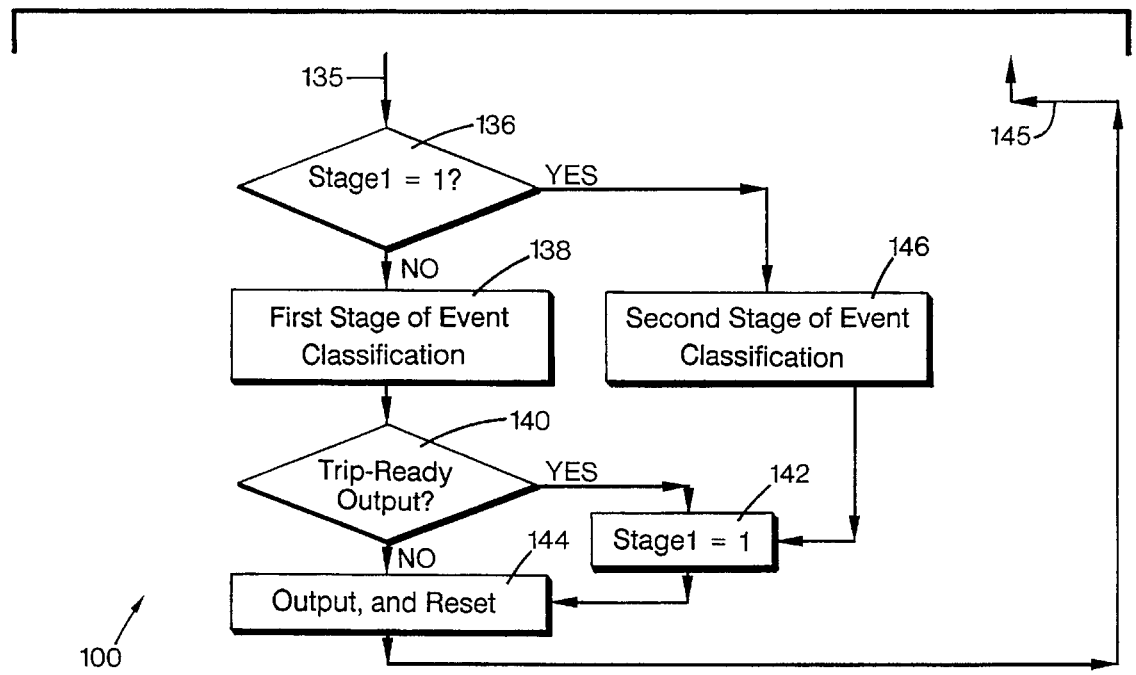

Referring FIGS. 2 and 3, a flow chart 100 illustrates a method of detecting, analyzing and discriminating between faults and normal events on a power line with reference to the operation of the illustrated load analyzer 10. The flow chart 100 shows one manner of operating the microcomputer system 48. First, data and variable preparation operations of the load analyzer 10 are described.

The Analysis Unit

To determine the presence of arcing and load level change, the rms value of the load current $I_L$ is monitored by transducer 30, conditioned by the signal conditioner 38, converted from an analog to a digital signal by converter 42. The digital signal 44 is sampled at the selected interval by sampler 45 to determine the sampled current signal 46 which is an input to the computer 50. To check for permanent variations in the load level and persistent arcing behavior, a sufficient time or number of rms data values, referred to herein as an analysis unit, is used. In the illustrated embodiment, this analysis unit is set at five seconds, which is equivalent to 300 rms data values. However, it is apparent that the analysis unit may be set at other values depending upon the particular implementation, such as by analyzing the energy of the load current $I_L$ over every two cycles.

Preferably, the analysis unit has a duration long enough to allow operation of conventional automatic protection devices, such as overcurrent breakers (not shown), installed on the feeder 12. Most utilities want the load analyzer 10 to operate only after operation of the conventional overcurrent protective devices (not shown), so the analysis unit is selected to a value on the order of 30 seconds. During the time analysis unit, the load analyzer 10 analyzes the pattern of the load to determine values for the variables Arc, Load-Loss, and Overcurrent Level.

Data Management and Storage

The normal load level, situation exists when there are no abnormal indications during an analysis unit. The feeder line 12 is continually monitored, and the normal load level is updated over time analysis unit by analysis unit. Each succeeding analysis unit is compared with the previous analysis unit to provide a long term load comparison. The RAM 52 has two data storage locations designated herein as Packet #1 or $P_1$, and Packet #2 or $P_2$. The newly updated normal data is stored in the Packet #1 location in the RAM, and the new incoming data fills Packet #2.

If Packet #2 is found to be normal data, then the 300 data values in Packet #2 are moved or swapped into Packet #1, leaving Packet #2 empty. As the data is read by the computer 50, if an abnormal rms value is found in Packet #2, then a data pointer device, index or software control is frozen at the abnormal rms value. This abnormal rms value is then remembered and stored during the analysis, with the location of the abnormal within the data pack indicated by the pointer. All of the data values in Packet #2 which were entered before freezing of the pointer are moved into and stored in the Packet #1 located, eliminating the first portion of the data which was previously stored in Packet #1. Thus, Packet #1 contains and stores the newest normal data, which is a combination of the data from the previous analysis unit and the current analysis unit where the abnormal value is encountered. Packet #2 then stores only the post-disruption rms data values.

Abnormality or Disruption Check

To check for the presence of arcing and load level changes for each phase and the neutral, two data differencing checking routines are used:

1) the short term or first difference $D_F$, and 2) the long-term difference $D_L$.

These data differencing routines are useful to find any trend in this time series of data. The short term differencing routine ($D_F$) is used to set the Arc flag, and the long term differencing routine ($D_L$) is used to set the Overcurrent Level flag and the Load-Loss flag.

Short Term Trend Determination

The short term differencing routine ($D_F$) looks for changes in the incoming rms data stored in Packet #2 to recognize any random behavior of the data. As used herein, "short term variations" refers to variations occurring within about one second or so. The first difference $D_F$ is found by determining the difference between the neighboring rms values, indicated as X, in the incoming data stream:

$$D_{F(i)} = X_{(i)} - X_{(i-1)}$$

When the value of the first difference $D_F$ is out of a range of certain values defined by an abnormality threshold $T_{AB}$, a difference count $C_F$ is incremented by one. In the analysis unit, the difference count $C_F$ is accumulated and compared with a preset arc threshold value $T_{ARC}$. If the difference count $C_F$ is greater than the arc threshold value $T_{ARC}$, then the flag of the variable Arc is set to Y for yes, and otherwise is set to N for normal as a default. The random activity of arcing causes these short term difference trends. In addition to this method of arc detection, the load analysis process may also use other equivalent methods of arc detection known to those skilled in the art.

Long Term Trend Determination

The long term differencing routine ($D_L$) looks for changes between the incoming rms data stored in Packet #2 and the data from the previous analysis unit stored in Packet #1 to recognize any changes in the trend of the load level. The long term difference $D_L$ is found from calculating the long term load level trend from the rms data values as follows:

$$D_{L(i)} = X_{P2(i)} - X_{P1(i)}$$

where the subscript "P2" refers to the incoming data stored in Packet #2, and the subscript "P1" refers to data from the previous stream stored in Packet #1.

When the long term difference $D_L$ is above a level of overcurrent threshold $T_{OVC}$, then a flag for the variable Overcurrent Level is set to Y for yes, and otherwise as a default remains at N for normal. Once the Overcurrent Level flag is set to Y during an analysis unit, it remains unchanged for the remainder of the analysis unit.

When the long term difference $D_L$ is above a level of significant load loss threshold $T_{LOSS}$, then the flag of the variable Load-Loss is set to Y for yes, and otherwise remains as a default N for normal. For example, if the load drops percipitously, e.g., from 200A to 20A within a few cycles, then the Load-Loss flag is set to Y for yes to indicate such a significant loss of load. Once the Load-Loss flag is set to Y during an analysis unit, it remains unchanged for the remainder of the analysis unit.

Load Pattern Analysis Logic

Having described the manner in which data is handled by the load analyzer 10 and the manner in which the data is checked for abnormalities, the manner of discriminating among the conditions to determine what type of fault or event, such as events 22, 24, 25, 26 or 28, have occurred is described next. With the flags set to Y for yes or N for normal for the three variables, Arc, Load-Loss, and Overcurrent Level, the load pattern analysis proceeds in two stages of analysis and classification.

In the first stage, the flags of the three variables are analyzed to generate three pre-action commands (Trip-Ready, Alarm, and Normal) and the diagnosis status conditions or states. The six diagnosis status conditions with their various combinations of flag settings are shown in Table 1.

If the pre-action command is either Alarm or Normal it is the final analysis output, and in the illustrated embodiment, no further analysis occurs. If the pre-action command is Trip-Ready, the second stage of load pattern analysis begins.

TABLE 1

First Stage Load Pattern Analysis

| | Flag Settings | | Load Analyzer Outputs | |
|---|---|---|---|---|
| Case No. | Arc | Load-Loss | Over-current Level | Pre-action Command | Diagnosis Status-Condition/State |
| 1 | Y | N | N | Alarm | Tree Contact |
| 2 | Y | N | Y | Alarm | Overcurrent Event |
| 3 | Y | Y | N | Trip-Ready | Downed Conductor |
| 4 | Y | Y | Y | Trip-Ready | Broken Conductor Hitting Neutral |
| 5 | N | Y | N | Alarm | Load Change |
| 6 | N | Y | Y | Alarm | Broken & Dangling Conductor |
| 7 | N | N | Y | Alarm | Overcurrent Event |
| 8 | N | N | N | Normal | Normal Conditions |

In the second stage of load pattern analysis, only two of the three variables (Arc, Load-Loss, and Overcurrent Level) are used, depending upon which diagnosis status condition is encountered in the first stage. For example, for the downed conductor 22 of case #3 in Table 1, the two variables considered are the Arc and the Load-Loss as shown in Table 2. Depending upon the status of the flags, the action commands are either Trip, Alarm, or Wait.

TABLE 2

Second Stage Load Pattern Analysis for a Downed Conductor

| Flag Settings | | Analyzer Output |
|---|---|---|
| Arc | Load-Loss | Action Command |
| Y | Y | TRIP |
| Y | N | Alarm |
| N | Y | Alarm |
| N | N | Wait |

Case #4 of Table 1 diagnoses an overcurrent event 26 comprising a broken conductor hitting a neutral. This case uses another second stage of analysis based on consideration of the two variables the Arc and Overcurrent Level, as shown in Table 3. Depending upon the status of the flags, the action commands are either Trip, Alarm, or Wait.

TABLE 3

Second Stage Load Pattern Analysis For a Broken Conductor Hitting Neutral

| Flag Settings | | Analyzer Output |
|---|---|---|
| Arc | Overcurrent Level | Action Command |
| Y | N | TRIP |
| N | N | Alarm |
| Y | Y | Wait |
| N | Y | Wait |

Although several cases in Table 1 have a first stage pre-action command of Alarm, it is apparent that some utilities may prefer a Trip-Ready pre-action command for some of these situations. For example, a Trip-Ready pre-action command may be preferred for tree contact 25 on feeders through certain forested areas, such as in a National forest, park or monument area. The second stage analysis would then be conducted for any tree contact events 25. As another example, in urban settings a dangling conductor 24 may be considered a safety hazard of the same degree as a downed conductor 22. For a dangling conductor 24, the second stage of analysis considers the states of the Load-Loss and Overcurrent Level flags to provide action commands of Wait and Trip, as shown in Table 4. Individual utility operators may determine and set these truth tables to other values (yes or no) as they deem appropriate for particular implementations.

TABLE 4

Second Stage Load Pattern Analysis for a Dangling Conductor

| Flag Settings | | Analyzer Output |
|---|---|---|
| Arc | Overcurrent Level | Action Command |
| Y | Y | Wait |
| Y | N | TRIP |
| N | Y | Wait |
| N | N | Wait |

The analysis is divided into first and second stages with the first stage having a pre-action Trip-Ready command to allow more certainty and security in the identification of the event as a particularly hazardous one requiring trip, such as the downed conductor 22. The Wait action refers to waiting a few seconds before sampling again to allow time for operation of the coordinated protection devices (not shown) installed on the feeder line 22. Such coordinated protection devices include overcurrent relays, fuses and reclosers. For example, if the action command is Wait, the illustrated load analyzer 10 waits for about five seconds, and then aborts all the flags and settings, then repeats the first stage load pattern analysis of Table 1.

To further enhance security of the load analyzer 10 and allow operation of the coordinated protection devices, an initial delay period is inserted before the first stage analysis begins. The two stage load pattern analysis is not invoked until there is an indication of an abnormal event which may lead to a trip or alarm decision. To accomplish this initial delay, the load analyzer 10 has an initialization timer (not shown) which may be internal to the computer 50, for setting an initial delay period. In the illustrated embodiment, the initial delay is set for 30 seconds, although duration selected depends upon the particular implementation because feeders typically have unique operational characteristics and parameters.

Upon detecting an abnormal event, the initialization timer begins to run to allow the conventional protection devices (not shown) installed on the feeder 12 to operate before the first stage analysis begins. If the conventional protection devices have not worked by the end of the 30 second delay period, before issuing a command, the load analyzer 10 delays an additional five seconds while the data storage Packet #2 is filled. The second stage analysis may immediately follow completion of the first stage analysis. However, in some implementations it may be preferable to insert an interstage delay period between the two analysis stages, for example by emptying and refilling Packet #2 before commencing the second stage analysis.

The Wait command of the second stage analysis also increases confidence in the diagnosis that indeed a fault situation requiring a trip exists to prevent unnecessary trips. For example, many utilities want the load analyzer 10 to trip only when arcing is accompanied by a broken conductor per Table 2 (Y for Arc and Load-Loss). If the arcing is intermittent and goes away for seconds at a time, this indicates a conductor on the ground. The load analyzer 10 looks for immediately present arcing, then waits if there are no indications of arcing or load loss, or alarms if only Load-Loss is detected.

The case #2 situation may be caused by a variety of overcurrent events 26, such as a customer overload, the touching or tangling of two or more phase conductors, or a lightning strike which occurred within the initial delay period, here, within the preceding illustrated 30 second period. Tangled conductors may appear as either case #2 or #7 conditions, depending upon whether or not arcing exists. If the conductors remain tangled for more than the illustrated 30 second initial delay period, then the conductors are probably permanently tangled. To prevent melting of the tangled conductors, the overcurrent protection devices (not shown) operate to deenergize the feeder 12 well before the end of the 30 second delay period. Momentary touching or contacting of two or more conductors may appear as case #2, #4, #6 or #7, each of which have an Overcurrent Level flag set to Y. While the exact diagnosis of some of the overcurrent events 26 may elude the load analyzer 10, a reasonable conjecture based on strong possibilities may be made as to which overcurrent event has occurred. Operator inspection of the feeder 12 may be ultimately required to attempt to determine which type of overcurrent event 26 indeed occurred.

Threshold Value Settings

The first difference $D_F$ is compared to the abnormality threshold $T_{AB}$, the difference count $C_F$ is compared with the preset arc threshold $T_{ARC}$, and the long term difference $D_L$ is compared to the level of overcurrent threshold $T_{OVC}$ and to the load loss threshold $T_{LOSS}$. These threshold values $T_{AB}$, $T_{ARC}$, $T_{OVC}$ and $T_{LOSS}$, may be established by studying the normal load data in a statistical manner. The load level change is determined by comparing the normal or predisruption load level stored in Packet #1 with the new post-disruption load level stored in Packet #2 of the RAM 52.

Load Analysis Flow Chart

Referring to FIGS. 2 and 3, the flow chart 100 for the illustrated software embodiment of the load analyzer 10 shows one method of analyzing faults occurring on the feeder 12. Before beginning the actual load analysis routine, an initialization routine or device 102, performs an initialization process. The initialization routine 102 sets several flags and indices. A disruption index is set to zero to indicate a normal current status, with no disruption thus far being found. The difference counter $C_F$ is set at zero because no arcing behavior is found under normal conditions. The flags of Arc, Load-Loss and Overcurrent Level are set to N for normal as a default. A stage index is set at zero to indicate that the data analysis is not yet in second stage. The data Packet #1 in RAM 52 is filled with 300 normal rms data values representing the load current $I_L$. From the rms data in Packet #1, the first difference $D_F$ is calculated, and the initialization process is then complete.

After initialization a read data and increment pointer device or routine 104, sequentially reads each value of rms data, and advances a data pointer by one as each data point is read. In a stage one checking routine or device 106, the stage is determined by checking the stage index. A stage index of "one" indicates the data analysis is in the second stage, and zero indicates that it is not. In a first disruption checking device or routine 108, the disruption index is checked to see if the rms data value received differs from that previously received to indicate the occurrence of one of the events 22, 24, 25, 26 or 28.

In the illustrated embodiment, if both the stage index and the disruption index are zero, then a first difference calculating device or routine 110 calculates the first difference $D_F$ according to the equation described above. The first difference $D_F$ is then compared to the abnormality threshold value $T_{AB}$ by an abnormality threshold comparison device or routine 112. If the first difference $D_F$ is above the abnormality threshold $T_{AB}$ or below the negative value of the abnormality threshold ($-T_{AB}$), the disruption index is set to "one".

In a second disruption checking routine or device 114, if the disruption index remains zero and no abnormality has been found, a pointer status checking routine or device 116 determines whether the analysis unit is complete. In the illustrated embodiment, the analysis unit was chosen as five seconds, or 300 normal rms data units. If the data pointer is indeed at 300, the analysis unit is complete and the data in Packet #2 is swapped into Packet #1 by a data packet swap routine or device 118. Then, in a pointer reinitialization routine or device 120, the data pointer is reset to zero. If the illustrated checking routine 116 indicates the data pointer is at a value less than 300, the rms values of the next data point are read by the data read and increment pointer routine 104, and the cycle continues.

If the disruption status routine 114 determines that the disruption index is "one," a pointer freeze and data packet rearrangement routine or device 122 freezes the data pointer to remember the value and location of the rms data at the disruption time. In the illustrated embodiment, the data packet rearrangement portion of routine 122 attaches the predisruption data from Packet #2 to the end of the data stream stored in Packet #1, which displaces the earliest data from Packet #1. Following this data packet rearrangement, the pointer is reset to zero by a another reset pointer routine or device 124, and the next rms data value is read by routine 104.

Although the stage index is still set at zero, the disruption status check routine 108 notes the disruption index is now set at "one." When the disruption index is "one," a difference calculation device or routine 126 calculates the first difference $D_F$ and the long term difference $D_L$ according to the equations discussed above. In a first difference comparison routine or device 128, if the first difference $D_F$ is found to be greater than the abnormality threshold $T_{AB}$, or smaller than the negative value of the abnormality threshold ($-T_{AB}$), then the difference counter $C_F$ is incremented by one.

In a long term difference comparison routine or device 130, the long term difference $D_L$ is compared to two different thresholds. If the value of the long term difference $D_L$ is greater than the level of overcurrent threshold $T_{OVC}$, then the Overcurrent Level flag is set to Y. If the long term difference $D_L$ is greater than the load loss threshold $T_{LOSS}$, the Load-Loss flag is set to Y. These flag settings remain unchanged until the data Packet #2 is full as determined by a second pointer status routine or device 132. When the illustrated pointer status routine 132 determines that data Packet #2 is full, a difference count comparison device or routine 134 compares the difference count $C_F$ with the arc threshold level $T_{ARC}$ to set the Arc flag. If the difference count $C_F$ is greater than the arc threshold level $T_{ARC}$, the Arc flag is set to Y, and if $C_F$ is less than or equal to $T_{ARC}$, then the Arc flag is set to N. The flag settings and status of the indices are carried as a signal 135 which links together the portions of the flow chart 100 shown in FIGS. 2 and 3.

With the flag settings of the three variables, Load-Loss, Overcurrent Level, and Arc, set as described above, the event classification logic is applied in two stages, as described above with reference to Tables 1–4. Referring now to FIG. 3, another stage status checking device or routine 136 determines whether the load pattern analysis is in the first or second stage, with the first stage being indicated by a stage index of zero, and the second stage being indicated by a stage index of "one." In a first stage of event classification routine or device 138, the logic illustrated in Table 1 is performed. A trip-ready output status routine or device 140 determines whether the pre-action command of the first stage logic is Trip-Ready or not.

If the pre-action command is indeed Trip-Ready, a stage advancing device or routine 142 changes the stage index to "one," indicating commencement of the second stage analysis event classification. Whether the analysis is in the first or second stage, an output and resetting device or routine 144 generates a signal 145 to empty the data stored in Packet #2 of the RAM 52. The signal 145 links together the portions of the flow chart 100 shown in FIGS. 2 and 3. The load analyzer 10 begins reading data using the read data routine 104. The new incoming data stream is stored in Packet #2 for the second stage of event classification. The second stage of analysis is noted by routine 106, and routine 126 calculates $D_F$ and $D_L$. Then routine 130 sets the Overcurrent Level flag and the Load-Loss flag. When routine 132 indicates that Packet #2 is full, the Arc flag is set by routine 134. The stage status routine 136 determines the load analyzer 10 is in the second stage of analysis, and a second stage event classification device or routine 146 interprets the flag settings in accordance with the logic of Tables 2, 3 and 4 (if used), as applicable.

If the illustrated trip-ready routine 140 determines that the pre-action command of the first stage event classification is either Alarm or Normal, this is the final action performed by the load analyzer 10 and the status determined with reference to Table 1 is the final diagnosis status condition. Output status signals are sent to the display 74 and any peripheral device 70 to indicate the status of the system. For an event classification generating an Alarm output, the alarm signal 76 activates the alarm 78. If the second stage of event classification reaches the action command of Trip, then the breaker interface 60 sends a trip signal 64 to the trip circuit 66 to deenergize the feeder line 12 by disconnecting it from the substation 16.

Advantageously, the load analyzer 10 and method of analyzing faults described herein identify load patterns to recognize and distinguish situations in which a power line is broken or intact. In this manner, security against false trips is provided in the classification and detection of high impedance faults. Thus the overall security and reliability of downed conductor fault detection is greatly enhanced beyond the capabilities of the earlier systems described in the background portion above.

SECOND EMBODIMENT

Figure 5:
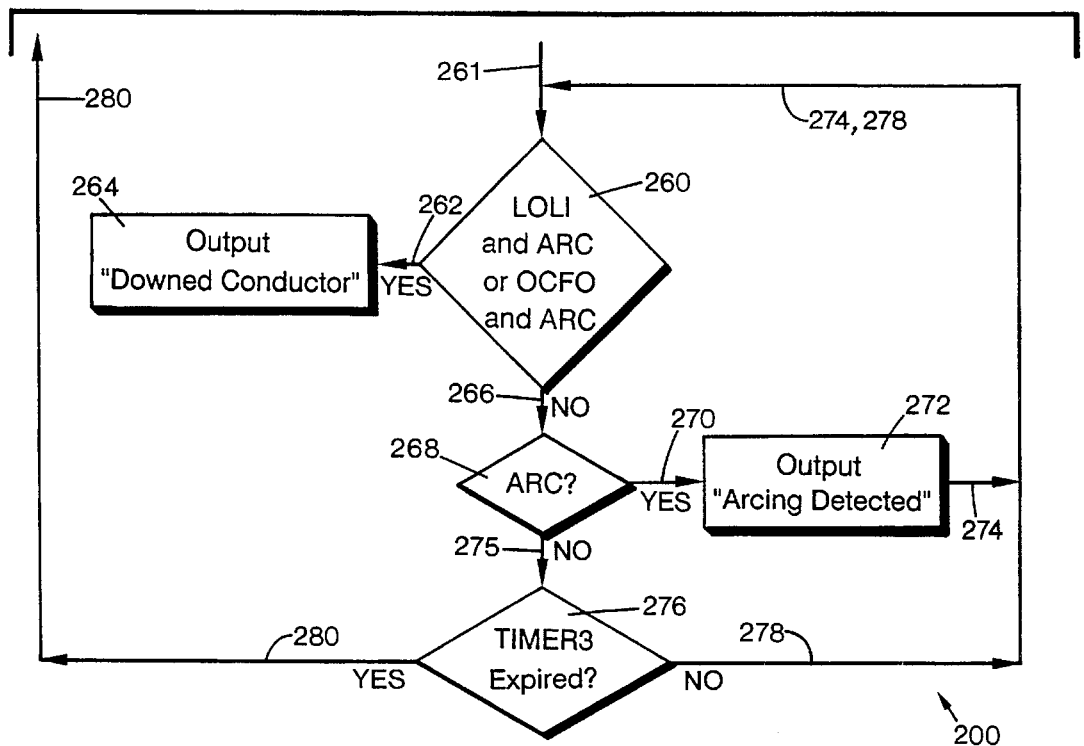
FIGS. 4 and 5 are portions of a flow chart illustrating a second embodiment for operating the load analysis apparatus of FIG. 1.
Figure 4:
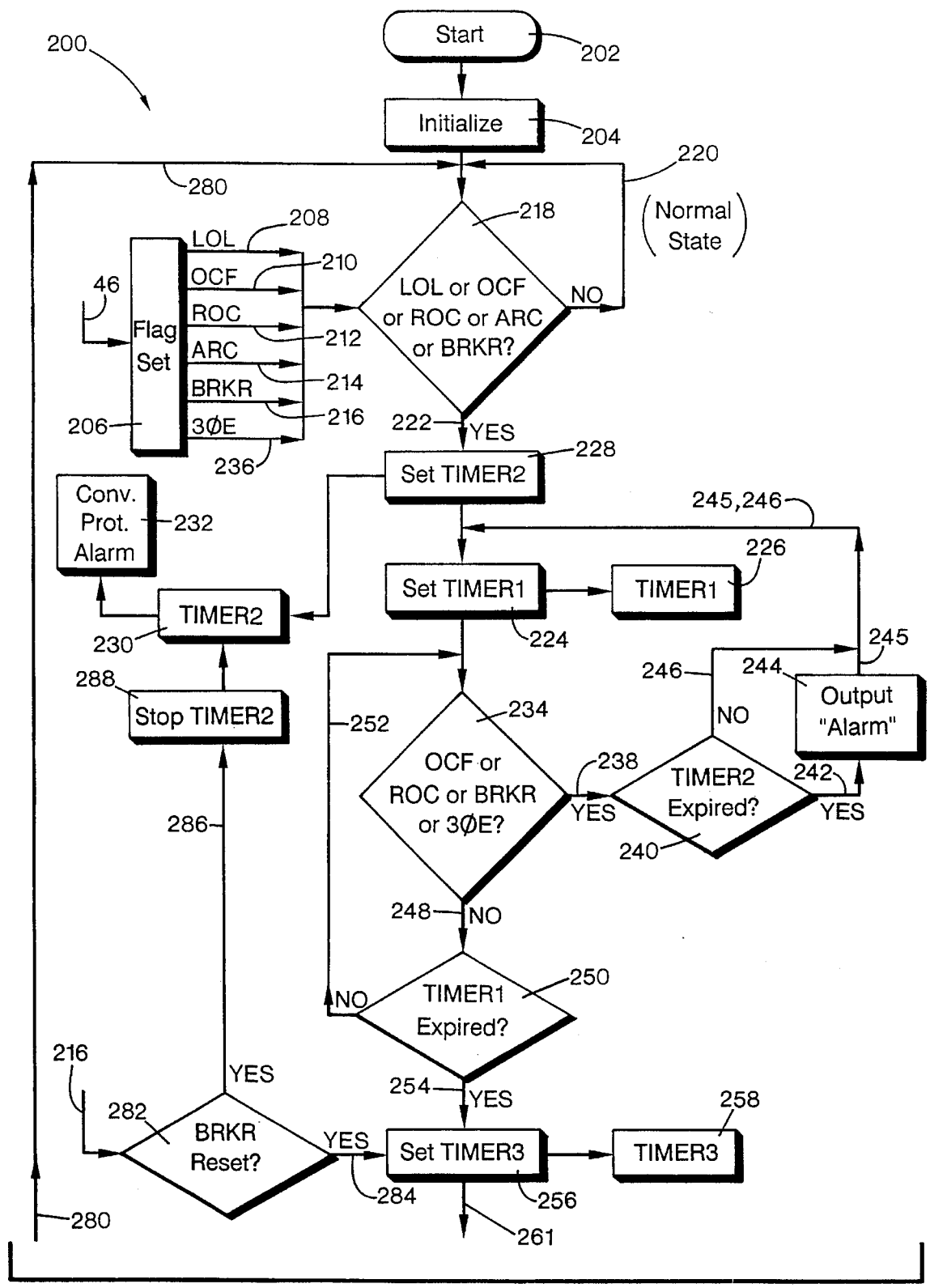

Referring FIGS. 4 and 5, a flow chart 200 illustrates a method of detecting, analyzing and discriminating between faults and normal events on a power line with reference to the operation of the illustrated load analyzer 10. This second embodiment may be used alone, or in conjunction with the first embodiment of FIGS. 2 and 3. The flow chart 200 shows an alternate preferred manner of operating the microcomputer system 48. The variables used in flow chart 200 are defined as follows:

| | |
|---|---|
| OCF: | Overcurrent Flag Set |
| ROC: | High Rate-of-Change Flag Set |
| LOL: | Significant Loss-of-Load Flag Set |
| ARC: | Arcing Flag Set |
| 3φE: | Three Phase Event Flag Set |
| BRKR: | Breaker Open Flag Set |
| LOLI: | LOL Flag was the flag which initially caused the transition into the non-normal state. |
| OCFO: | Overcurrent flag was set at some time while the algorithm was in the non-normal state. |
| TIMER1: | Conventional Protection Coordination Timer |
| TIMER2: | Conventional Protection Malfunction Timer |
| TIMER3: | Breaker Reset Timer |

When the load analyzer 10 is operated in accordance with flow chart 200, upon receiving a start command 202 from an operator, an initialization routine or device 204 performs an initialization process to set flags and indices to initial values as described below. A flag setting routine or device 206 uses conventional checking routines to determine from the sample current signal 46 whether one or more of the following events has occurred:

1. A significant, precipitous loss of load (LOL);
2. An overcurrent level is detected (OCF);
3. A high rate of change in current (ROC);
4. Significant arcing is detected (ARC); or
5. A breaker-open condition is detected (BRKR).

When a loss of load occurs, the flag setting device produces a loss of load flag set (LOL) signal 208. When an overcurrent level is detected, the flag setting routine 206 generates an overcurrent flag set (OCF) signal 210. When the flag setting routine 206 determines that a high rate of change in current has occurred, a high rate of change flag set (ROC) signal 212 is generated. When the flag setting routine detects significant arcing, it generates an arcing flag set (ARC) signal 214. When the circuit breaker coupled to trip circuit 66 is open, the flag setting routine 206 produces a breaker-open flag set (BRKR) signal 216.

After initialization by routine 204, a line status checking device or routine 218 constantly monitors signals 208–216 from the flag setting routine 206. If none of the flags are set, the system is considered to be in a normal state, and the checking routine 218 issues a NO signal 220 to initialize the next sequence of the checking routine.

When the checking routine 218 determines one or more of the flag setting signals 208–216 indicate that an event has occurred, the analyzer 10 enters a triggered state and the checking routine 218 issues a YES signal 222. In response to the YES signal 222, two timers are set with a set TIMER1 device or routine 224 setting the first timer 226 and a set TIMER2 routine or device 228 setting the second timer 230. The first timer 226 has a time duration selected to coordinate with conventional overcurrent protection on the transmission line 12. The second timer 230 detects whether the conventional overcurrent protection is not operating as intended when it continues to operate beyond a reasonably period of time.

For instance, depending upon the conventional protection reset times used by a utility, certain patterns of load current may cause the conventional protection to start through its sequence toward lockout. If the fault experiences periods of inactivity which are sufficiently long to cause the conventional protection to reset itself, the conventional protection must start again from the beginning of its sequence when the fault current returns to a high level. If this situation occurs repetitively, the conventional breaker may never reach a lockout state.

In severe cases, such repetitive operation of a load breaking device, such as a breaker, can cause extensive, and perhaps even catastrophic, damage to the device. This continual resetting phenomenon may be caused by improperly coordinated trip settings with respect to downstream devices, or it may be caused by the intermittent nature of a downed conductor, high impedance fault. For either cause, the second timer initiates a conventional protection malfunction alarm 232 when such conditions are encountered.

After setting timers 226 and 230, the analyzer 10 waits for the first timer 226 to time out. While waiting, a second event checking device or routine 234 monitors the OCF signal 210 for overcurrent conditions, the ROC signal 212 for high rates of change in the phase and/or residual currents, the BRKR signal 216 for breaker openings, and a three phase event flag set (3φE) signal 236 generated by the flag setting device 206. The 3φE signal 236 is generated when the flag setting routine 206 determines the occurrence of a multi-phase fault event. When routine 234 detects the occurrence of one or more of these four events (OCF, ROC, BRKR, or 3φE) a YES signal 238 is generated.

When a second timer monitoring device or routine 240 receives the YES signal 238, it checks to see whether the count of the second timer 230 has expired. If the second timer count has indeed expired, the monitoring device 240 issues a YES signal 242 to a second event output alarm 244. If not, the monitoring device 240 issues a NO signal 245. A first timer reset is generated by a NO signal 246 from the second timer monitoring device 240. Upon receiving the either NO signal 245 or 246, the set TIMER1 routine 224 resets the first timer 226.

If the second event checking routine 234 detects none of the four events (OCF, ROC, BRKR, or 3φE), then a NO signal 248 is generated. When a first timer monitoring device or routine 250 receives the NO signal 248, it checks to see whether the count for the first timer 226 has expired. If the count of timer 226 has not expired, the monitoring device 250 generates a NO signal 252 which is returned to initialize the second event checking routine 234. If the monitoring device 250 determines the first timer count has expired, it generates a YES signal 254. When a set TIMER3 initialization routine or device 256 receives the YES signal 254, a third timer 258 is initiated.

Referring also to FIG. 5, while the third timer 258 counts, the proper output to be sent by the controller 35 to the peripheral device 70 or the alarm 78 is determined. Specifically, a downed conductor checking routine or device 260 receives a TIMER3 initiation signal 261 from initialization device 256. Upon receiving signal 261, the device 260 checks if and when the LOL signal 208, the ARC signal 214, and the OCF signal 210 indicated the occurrence of a significant loss of load, arcing, and overcurrent conditions, respectively. If arcing is present on the transmission line 12 as indicated by the ARC signal 214, and a significant loss of load indicated by the LOL signal 208 initially caused the analyzer 10 to enter a triggered state (abbreviated as "LOLI" in FIG. 5) then the checking routine 260 issues a YES signal 262.

Upon receiving the YES signal 262, a downed conductor output device 264 provides an output to the peripheral device 70. The checking routine 260 also monitors for arcing by checking the ARC signal 214. Routine 260 monitors for the combination of this arcing and an overcurrent condition which occurred during the triggered state. This is the same overcurrent condition which occurs when the second event checking routine 234 receives the OCF signal 210. When these two conditions are encountered, the checking routine 260 issues the YES signal 262 to the downed conductor output device 264.

If the checking routine 260 does not find that the LOL signal 208 initiated the triggered state ("LOLI"), or does not find that the OCF 210 was monitored by routine 234, and if arcing is still present, routine 260 issues a NO signal 266. When an arc checking routine 268 receives the NO signal 266 and the arc signal 214 still indicates the presence of an arc, the checking routine 268 issues a YES signal 270. When an arcing detected output device 272 receives the YES signal 270, an arcing detected output is provided, for example to the peripheral device 70. Also, when the output device 272 receives the YES signal 270, a continuation signal 274 is supplied to permit the checking routine 260 to continue to monitor for a downed conductor condition.

If the arcing condition checking routine 268 determines that the arc signal 214 is absent, a NO signal 275 is generated. When a third timer monitoring device or routine 276 receives the NO signal 275, it checks to see whether the count of the third timer 258 has expired. If not, the monitoring device 276 issues a NO signal 278 which is provided as a continuation signal to the downed conductor checking routine 260. If the monitoring routine 276 determines that the count of the third timer 258 has indeed expired, a YES signal 286 is generated and delivered to the initial line status checking routine 218 to return the load analyzer 10 to its "normal" state.

The condition of the breaker controlled by the breaker trip circuit 66, as indicated by the BRKR signal 216, is monitored by a breaker monitoring device 282 for monitoring whether the breaker is closed (conducting state) or open (non-conducting state). When the monitoring device 282 determines the breaker is closed, it issues two YES signals 284 and 286. The first YES signal 284 is provided to the set TIMER3 device 256 to reset the third timer 258. The second YES signal 286 is supplied to a stop TIMER2 device 288. The stop TIMER2 device 288 suspends the count of the second timer 230 but does not reset the timer whenever the breaker is closed to conduct.

CONCLUSION

Having illustrated and described the principles of our invention with respect to a preferred embodiment, it should be apparent to those skilled in the art that our invention may be modified in arrangement and detail without departing from such principles. For example, while the illustrated embodiment has been implemented in software, or discussed in terms of devices in some instances structural equivalents of the various hardware components and devices may be substituted as known to those skilled in the art to perform the same functions. Furthermore, while various hardware devices, such as the transducer and microcomputer are illustrated, it is apparent that other devices known to be interchangeable by those skilled in the art may be substituted. We claim all such modifications falling within the scope of the following claims.

We claim:

1. A method of analyzing faults occurring on a distribution circuit coupled to an AC power source, comprising the steps of:

monitoring a load current flowing over the distribution circuit;

analyzing the load current over time, said analyzing step including
- a first stage of analyzing the load current for arcing, load loss, and overcurrent level to produce a first stage analysis result; and
- a second stage of analyzing the load current for arcing and one of load loss and overcurrent level to produce a second stage analysis result;

distinguishing, based on the analysis of the load current, the difference between a first type of fault requiring de-energization of the distribution circuit, and a second type of fault for which the distribution circuit remains energized;

in response to the first stage analysis result, issuing a pre-action command comprising an alarm for the second type of fault, and a trip-ready pre-action command for the first type of fault; and in response to the second stage analysis result, issuing an action command comprising an alarm for the second type of fault, a trip command for the first type of fault, and a wait command to allow time for operation of any overcurrent protection devices installed on the distribution circuit.

2. A method according to claim 1 further wherein:

the second stage of analyzing comprises analyzing the load current for the presence of arcing and load loss; and the action command issuing step comprises:
- issuing an alarm command when only one of arcing and load loss is present;
- issuing a trip command when both arcing and load loss are present; and
- issuing a wait command in the absence of both arcing and load loss during the second stage of analyzing.

3. A method according to claim 1 further wherein:

the second stage of analyzing comprises analyzing the load current for the presence of arcing and overcurrent level; and the action command issuing step comprises:
- issuing an alarm command in the absence of both arcing and overcurrent level during the second stage of analyzing;
- issuing a trip command when only arcing is present during the second stage of analyzing; and
- issuing a wait command when both arcing and overcurrent level are present and when only the overcurrent level is present during the second stage of analyzing.

4. A method according to claim 1 wherein the monitoring step comprises monitoring the current signatures of each phase and of the ground current on the distribution circuit.

5. A method according to claim 1 wherein:

the distribution circuit comprises plural current carrying conductors; and the distinguishing step comprises the step of diagnosing the status of the distribution line, and distinguishing between the first type of fault comprising a downed conductor, a normal system event including switching and recloser operation, and the second type of fault comprising intermittent tree contact with a conductor, a broken and dangling conductor, and overcurrent conditions.

6. A method according to claim 1 wherein the analyzing step comprises the step of analyzing the load current over every two cycles of the load current.

7. A method according to claim 1 wherein:

the analyzing step comprises the step of analyzing the load current for a loss of load; and the distinguishing step comprises the step of identifying the first type of fault as a broken conductor of the distribution circuit when the analyzing step indicates the load current is less than a selected value comprising one of a selected threshold magnitude and a selected percentage of a full load value of the load current.

8. A method according to claim 1 wherein the analyzing step comprises the step of analyzing the load current for an increase above a selected percentage of an average level of load current and for random short term variations in current to determine the presence of arcing on the distribution circuit.

9. A method according to claim 1 wherein:

the analyzing step comprises the step of analyzing the load current for persistent arcing which persists longer than a selected time period; and the method further includes the step of indicating the occurrence of a first type of fault as a downed conductor in response to the persistent arcing.

10. A method according to claim 1 wherein the monitoring step comprises monitoring the load current periodically during sequential time analysis units and generating in response thereto a stream of incoming load current data values for each time analysis unit.

11. A method of analyzing faults occurring on a distribution circuit coupled to an AC power source, comprising the steps of:

monitoring a load current flowing over the distribution circuit during sequential time analysis units and generating in response thereto a stream of incoming load current data values for each time analysis unit;

initially storing a first stream of load current data values in a first data storage location;

storing a second subsequent stream of load current data values in a second data storage location;

checking each data value of the second stream for any abnormality;

when all of the data values in the second stream are found to be normal during the checking step, updating the data values stored in the first location with the data values stored in the second location;

when an abnormal data value is found during the checking step, storing the most recent normal data in the first location by replacing the oldest portion of the data values stored in the first location with the data from the second stream which precede the abnormal data value, and storing the post abnormality data in the second location;

analyzing the load current over time; and distinguishing, based on the analysis of the load current, the difference between a first type of fault requiring de-energization of the distribution circuit, and a second type of fault for which the distribution circuit remains energized.

12. A method according to claim 11 wherein the analyzing step comprises the steps of:

analyzing the load current for arcing by:
- determining a first difference between each successive data value in the stream;
- comparing the first difference with an abnormality threshold range;
- incrementing a difference count value when the first difference exceeds the abnormality threshold range;

comparing the difference count with an arc threshold value; and indicating an arc has occurred when the difference count exceeds the arc threshold value;

determining a long term difference between a current value in the data stream and a corresponding value in the previous data stream;

analyzing the load current for an overcurrent level by:
comparing the long term difference with a level of overcurrent threshold value; and indicating an overcurrent level condition has occurred when the long term difference exceeds the level of overcurrent threshold value; and analyzing the load current for load loss by:

comparing the long term difference with a load loss threshold value; and indicating a load loss has occurred when the long term difference is less than the load loss threshold value.

13. A method of analyzing faults occurring on a distribution circuit coupled to an AC power source, comprising the steps of:

monitoring a load current flowing over the distribution circuit;

analyzing the load current over time for plural types of conditions; and distinguishing, based on the analysis of the load current, the difference between a first type of fault requiring de-energization of the distribution circuit, and a second type of fault for which the distribution circuit remains energized, where the distinguishing step includes the steps of initiating plural timers, checking several of the plural types of conditions while the timers are running, and selectively providing alarms, downed conductor, and arcing outputs.

14. A method according to claim 13 wherein the method further includes the steps of:

setting the first timer for a duration selected to coordinate with conventional overcurrent devices on the distribution circuit; and setting the second timer to detect a malfunction of the conventional overcurrent devices on the distribution circuit.

15. A method according to claim 13 wherein: the analyzing step comprises a first step of analyzing the load current for a significant loss of load, overcurrent, high rate of change, and arcing conditions; and the method further includes the steps of monitoring the status of a breaker coupling the distribution circuit to the AC power source to determine when the breaker is open;

the distinguishing step includes the steps of initiating first and second timers when either the breaker is open or the significant loss of load, overcurrent, high rate of change, or arcing conditions are determined;

while the first timer is running, the analyzing step comprises a second step of analyzing the load current for overcurrent, high rate of change, and multiphase fault conditions;

the distinguishing step includes the step of providing an alarm when either the breaker is open or the overcurrent, high rate of change, or multiphase fault conditions are determined, and the second timer has expired; and the distinguishing step includes the steps of:
initiating a third timer when the first timer has expired, the breaker is closed, and neither the overcurrent, high rate of change, or multiphase fault conditions have been determined;

while the third timer is running, providing a downed conductor alarm when the arcing conditions is determined and the steps of initiating the first and second timers was performed in response to either the significant loss of load condition or the overcurrent condition; and while the third timer is running, providing an arcing detected alarm when the arcing condition is determined and the first and second timers were initiated in response to conditions other than significant loss of load or overcurrent.

16. A load analysis apparatus for analyzing faults occurring on a distribution circuit coupled to an AC power source, comprising:

a monitor for monitoring a load current flowing over the distribution circuit and in response thereto, generating a load signal, the monitor including a transducer coupled to the distribution circuit to indicate the load current magnitude and waveform;

a controller responsive to the monitor for analyzing the load current over time, and for distinguishing from the analyzed load current the occurrence of a first type of fault requiring de-energization of the distribution circuit, and of a second type of fault for which the distribution circuit remains energized; and a surge protector for protecting the load analysis apparatus from surges on the distribution circuit.

17. A load analysis apparatus according to claim 16 wherein the controller includes:

a signal conditioner for filtering and amplifying the load signal;

an analog-to-digital converter for sampling the conditioned load signal to generate a digital signal;

a digital signal processor for determining a frequency spectra of the digital signal to generate a frequency spectra signal;

a computer for analyzing the frequency spectra signal to detect the occurrence of the first or second types of faults;

a circuit breaker interface for generating a trip signal in response to identification of the first type of fault;

a communications interface for communicating with an external device; and a display responsive to the computer for indicating the occurrence of first and second types of faults.

* * * * *